(12) United States Patent
Chua et al.

(10) Patent No.: US 6,937,633 B2
(45) Date of Patent: Aug. 30, 2005

(54) MULTI-WAVELENGTH SEMICONDUCTOR LASERS

(75) Inventors: Soo Jin Chua, Singapore (SG); Jinhua Teng, Singapore (SG)

(73) Assignee: National University of Singapore, Singapore (SG)

(*) Notice: Subject to any disclaimer, the term of this patent is extended or adjusted under 35 U.S.C. 154(b) by 0 days.

(21) Appl. No.: 10/311,868

(22) PCT Filed: Jun. 20, 2001

(86) PCT No.: PCT/SG01/00124

§ 371 (c)(1),
(2), (4) Date: May 29, 2003

(87) PCT Pub. No.: WO01/99248

PCT Pub. Date: Dec. 27, 2001

(65) Prior Publication Data

US 2003/0219055 A1 Nov. 27, 2003

(30) Foreign Application Priority Data

Jun. 21, 2000 (SG) .......................... 200003503

(51) Int. Cl.[7] ................................................ H01S 5/00
(52) U.S. Cl. ........................................ 372/50; 372/43
(58) Field of Search ........................ 372/43, 50, 48

(56) References Cited

U.S. PATENT DOCUMENTS

| | | | | |
|---|---|---|---|---|
| 4,318,058 A | * | 3/1982 | Mito et al. .................... 372/50 |
| 5,222,163 A | * | 6/1993 | Handa et al. .................. 385/14 |
| 5,642,448 A | | 6/1997 | Pan et al. ...................... 385/31 |
| 2003/0103745 A1 | * | 6/2003 | Maier ........................... 385/122 |
| 2003/0113053 A1 | * | 6/2003 | Kuramata ..................... 385/14 |

OTHER PUBLICATIONS

IEEE Photonics Technology Letters, vol. 11, No. 9, issued Sep. 1999 (IEEE), Ibsen Morten et al., "8– and 16–Channel All–Fiber DFB Laser WDM Transmitters with Integrated Pump Redundancy", pp. 1114–1116.

Patent Abstracts of Japan, Publication No. 2000165328, Date of Appln. Publication Jun. 16, 2000; entitled "Alignment Data Decision System in Optical Communication Connection"; Inventors: Dr. Peter Winzer and Dr. Andras Kalmar; Applicant: Contraves Space AG; Appln No. 11153677; Appln. Date: Jun. 1, 1999.

* cited by examiner

*Primary Examiner*—Don Wong
*Assistant Examiner*—Leith Al-Nazer (57) ABSTRACT

A multi-wavelength semiconductor laser is formed by monolithically integrating a plurality of laser diodes (1, 2) with at least one isolator section (3) and a coupler (4), which couples the different emission wavelengths $\lambda_1$, $\lambda_2$ into one output port (5). The isolator section can be either a light absorptive type or wavelength selective type, including a Bragg grating type isolator or a photonic bandgap crystal type isolator. The coupler is preferably a Y-junction coupler, but can also be a multi-branch waveguide coupler or a waveguide directional coupler.

15 Claims, 8 Drawing Sheets

MULTI-WAVELENGTH SEMICONDUCTOR LASERS

FIELD OF THE INVENTION

The present invention pertains to the field of semiconductor laser fabrication and in particular to a method for manufacturing integrated single output multiple wavelength lasers and related photonic integrated devices to be utilized in wavelength division multiplexing (WDM) optical communication system, optical recording and measurement

BACKGROUND OF THE INVENTION

Multi-wavelength laser sources are key elements for a variety of applications such as wavelength division multiplexing (WDM), optical recording, color displays and optical color printing. Several methods have been proposed and patented for the realization of these multi-wavelength laser sources and the integration with modulators, as can be seen in U.S. Pat. No. 4,955,030 (Menigaux), U.S. Pat. No. 4,831,629 (Paoli), U.S. Pat. No. 4,993,036 (Ikeda), U.S. Pat. No. 5,384,797 (Welch), U.S. Pat. No. 5,519,721 (Takano). They can be realized by the non-uniform current pumping resulting in areas with different band filling, selective area epitaxy or quantum well intermixing. The last two methods can also be used to fabricate the lasers integrated with modulators.

However, many of the multiple wavelength laser sources or arrays fabricated rely on a large spatial separation between different wavelength elements, and therefore complex focusing optics are required to align the individual lasers to the optical fiber. It is desirable that all the laser emissions are combined monolithically together on a wafer so that the alignment restrictions can be eliminated. One method uses serially aligned semiconductor lasers each with a directional coupler [see U.S. Pat. No. 5,233,187, Japanese Patent 05090715, European Patent 496348, Sakata]. An inevitable drawback of this method is that there cannot be many wavelengths integrated together otherwise the device will be too long and the internal loss will be large. Also the grating must be optimized to act both as a directional coupler and the wavelength selective reflector. Another method is to combine parallel aligned laser arrays into one output port by use of appropriate waveguide alignment, such as the Y-junction coupler, rib waveguide coupler structures etc [See Japanese Patent 24209, 58175884, IEEE Photon. Technol. Lett. Vol. 7, pp. 944–946, 1995]. One problem arising from the combination of different wavelengths together is that the cross talks among these wavelengths are inevitable without additional treatment. The longer wavelength laser element will be optically pumped to lasing even only when the shorter wavelength laser element is electrically biased. The consequence is that each wavelength is not independently addressable. One method is to add an electroabsorption type modulator to each laser element. This method is a little complicated since it needs a lot of additional electrodes to control each modulator.

In this patent we propose a new method, the introduction of an isolator, to provide the needed isolation among different wavelength laser elements. It does not need additional electrodes so it is simple to fabricate and easy to operate. We also provide the method of fabricating the said isolator and other integrated optoelectronic devices.

SUMMARY OF THE INVENTION

The invention has as its objective, to introduce an isolator or isolators monolithically integrated with the semiconductor laser arrays and to provide an easy method of producing integrated multiple wavelength semiconductor lasers that can independently emit each wavelength in one spot.

According to one aspect of the invention, there is provided A multi-wavelength semiconductor laser comprising:

a plurality of laser diode sections in parallel arrangement and having different emission wavelengths relative to each other;

at least one isolator section, the or each of said isolator sections being integrated with a respective one of said laser diode sections;

a coupler integrated with the laser diode sections and the at least one isolator section to couple the different emission wavelengths into one output port.

The multi-wavelength semiconductor laser comprises three essential components: laser diode sections; at least one isolator section; and a coupler. The cavities of the laser diode sections form a parallel array to provide different emission wavelengths with each wavelength independently addressable. The coupler is used to couple the different wavelengths into one output port. The coupler may be, for example, a Y-junction coupler, a multi-branch waveguide coupler or a waveguide directional coupler such as a rib waveguide directional coupler. The isolator section is used to isolate the cross talks among the different wavelengths so as to ensure that the device can emit either each wavelength singly or their desired combinations.

The isolator section may be, for example, either a wavelength selective type or a light absorptive type. For the first type, it can be a distributed Bragg grating type isolator or a photonic bandgap crystal type isolator which is transmissive to one wavelength of the laser diode section but highly reflective to other wavelengths. For a dual wavelength laser source comprising two laser diode sections, an isolator may be integrated with one or each of laser diode sections and tuned to reflect the other wavelength which is not desired. For the second type of isolation, the isolator has a band gap energy transparent to the laser wavelength of the laser diode section but absorbing to all other laser wavelengths. There is no need for an electrical contact for the isolation region thus giving rise to ease of fabrication and operation.

In another embodiment, the multi-wavelength semiconductor laser comprises four laser diode sections, at least three of which are integrated with a respective isolator section. In this case, the coupler may include a series of Y-junction couplers coupled by intermediate elements or may include a four-branch coupler.

The integrated multi-wavelength laser source is advantageously fabricated using a quantum well based heterojunction semiconductor laser structure. The semiconductor substrate is preferably made of either GaAs or InP. The quantum well can be made of GaAs, InGaAs, InAlGaAs, or InGaAsP. The device can be made either by selective area metal organic vapor phase epitaxy (MOVPE) or by post growth quantum well intermixing technology. By controlling the area of the semiconductor laser surface covered by the intermixing inhibiting layer, such as the Ge layer, a one step selective area impurity free quantum well intermixing can be used to fabricate such devices.

DETAILED DESCRIPTION OF THE INVENTION

Figure 1A:
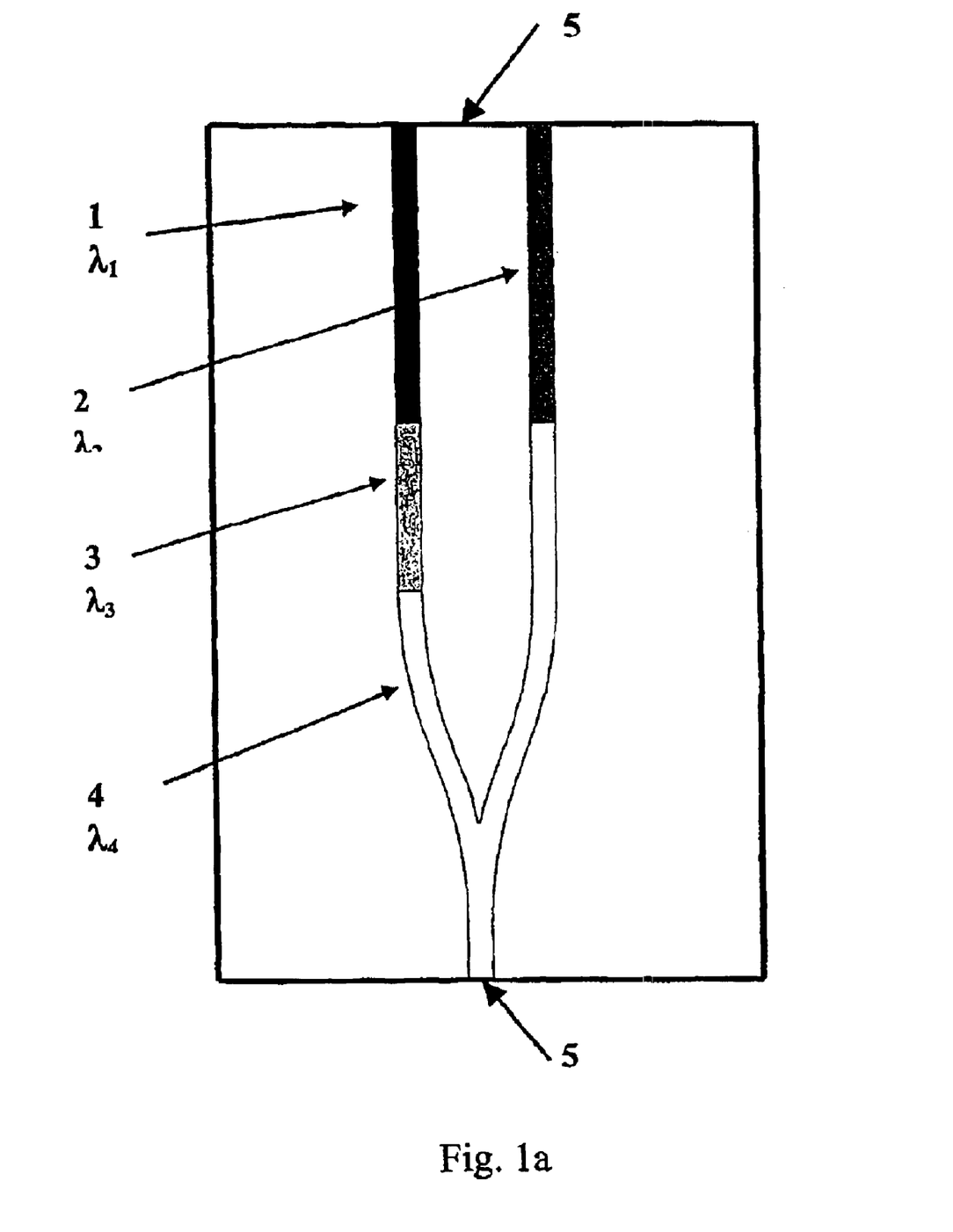
FIG. 1a is a schematic waveguide structure of a dual wavelength laser source with monolithically integrated Y-junction coupler and isolator.

Referring to FIG. 1a, there is shown a schematic waveguide structure of a dual wavelength laser source monolithically integrated with an isolator and a Y-junction coupler. It contains laser diode sections 1 and 2, an isolator 3 and a Y-junction coupler 4. The structure includes cleaved laser facets 5.

Figure 1B:
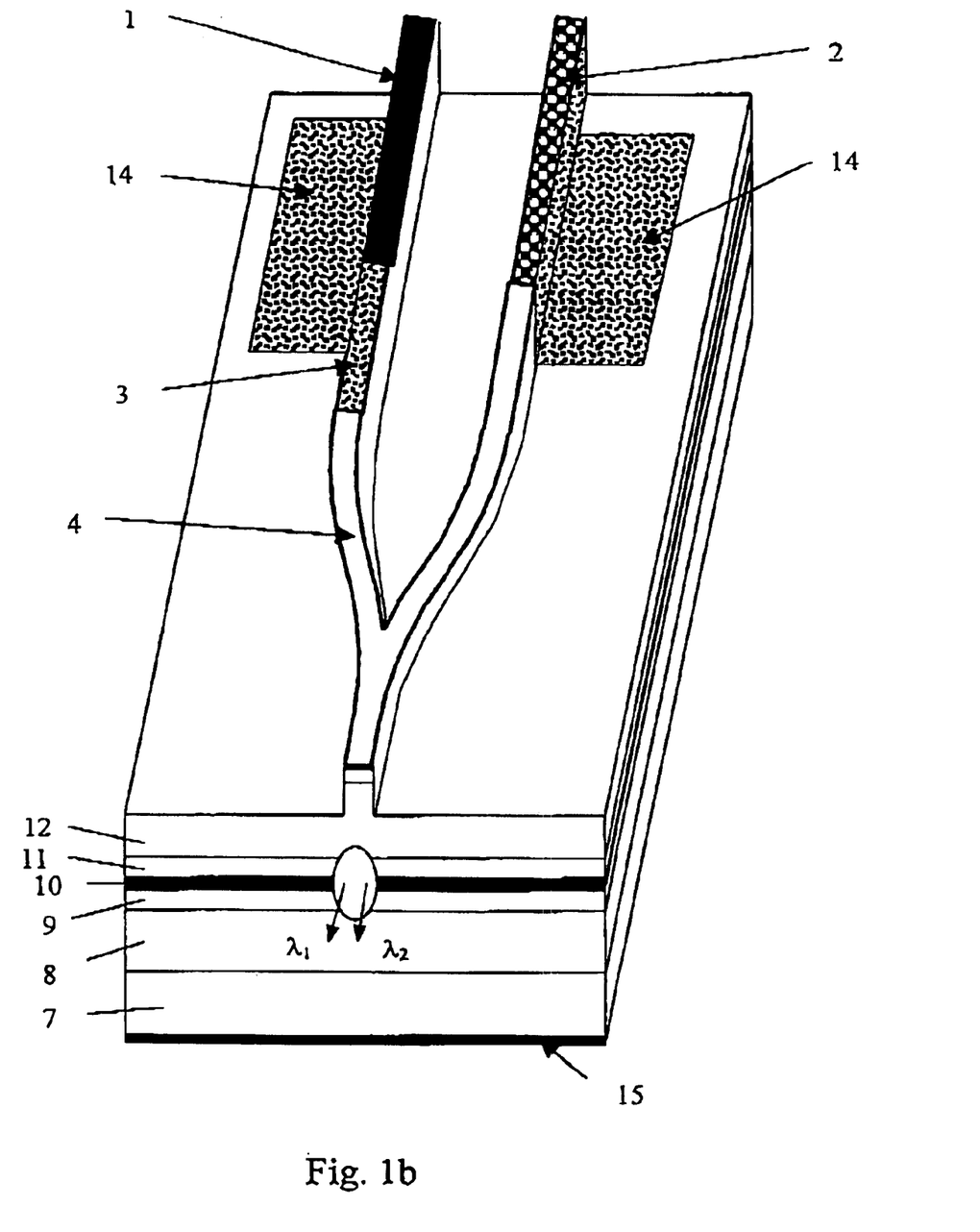
FIG. 1b is a diagram of the device with ridge waveguide and vertical layer structure shown.

The Y-junction coupler 4 is used to direct the two signals from the laser diode sections, (i.e. gain regions) 1 and 2 into a single output port. The length of the gain region and isolation region are 700 μm and 300 μm respectively. The Y-junction coupler 4 is composed of two S-bends with a radius of curvature of 1328 μm. The central space between the two branches is 34 μm. The bending loss in the Y-junction waveguide should be kept small in the design. FIG. 1b shows the schematic diagram of a ridge waveguide and vertical layer structure. The ridge waveguide can be formed by either wet chemical etching or Plasma dry etching (ICP or RIB). The wafer is a graded index separate confinement heterojunction (GRINSCH) laser structure. The n-type substrate 7 can be either GaAs or IhP or other relevant semiconductors. A lower cladding layer 8 is provided with n-type doping to $2\times10^{18}$ cm$^{-3}$ while an upper cladding layer 12 is provided with p-type doping to $5\times10^{18}$ cm$^{-3}$. There is also provided lower and upper confinement layers 9 and 11, wherein 10 is the active region with a quantum well structure, and metal contacts 14 and 15 for the electrode.

The gain regions 1 and 2 have different wavelengths $\lambda_1$ and $\lambda_2$. The Y-junction coupler region has a bandgap with an equivalent wavelength $\lambda_4$ that must be short enough to ensure that it is completely transparent to the laser wavelengths $\lambda_1$, $\lambda_2$. The isolator 3 has an equivalent wavelength $\lambda_3$ that should be low enough to be transparent to $\lambda_1$ but be absorbing to $\lambda_2$ so that the laser light from channel 2 will not optically pump channel 1 when only channel 2 is electrically biased. As a result, the two lasers can be operated either simultaneously or separately. Different band gap regions in the wafer can be realized by either selective area MOVPE or by a one step selective area-quantum well intermixing.

Figure 2A:
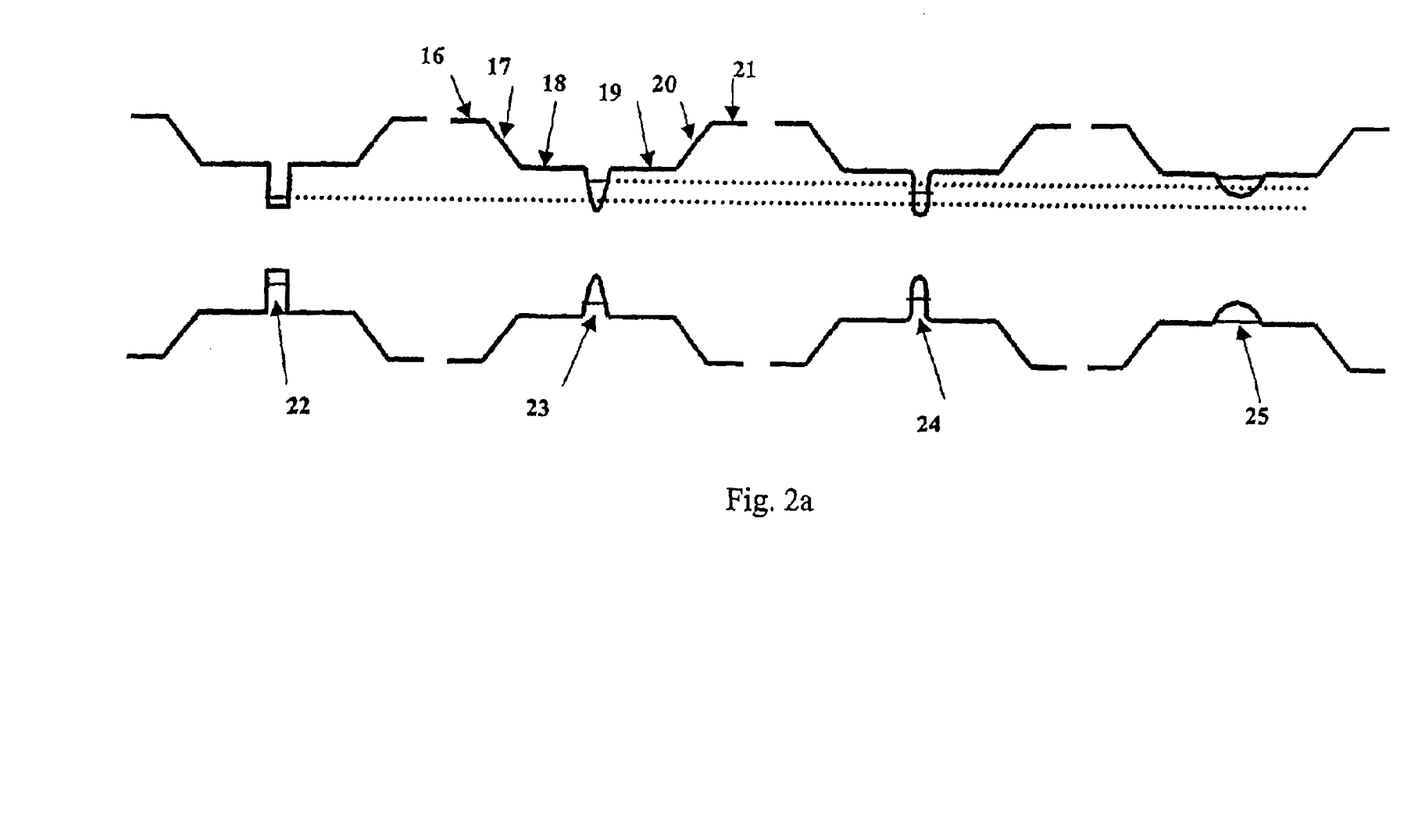
FIGS. 2a and 2b illustrate the band diagram and the experimental results of the relative photoluminescence spectra for the four different sections in the dual wavelength laser source after a one step selective area intermixing.

FIG. 2a shows a schematic band diagram illustrating the four different bandgap regions realized by quantum well intermixing. The energy levels in the quantum well are represented as numerals 22, 23, 24 and 25 for laser diode section 1, isolator section 3, laser diode section 2, and Y-junction coupler section 4 respectively. Due to the interdiffusion of the well and barrier elements, the quantum well shape and composition changed thus leading to blueshift of the quantum well energy levels. The p and n type cladding layers are represented as 16 and 21 respectively.

Figure 2B:
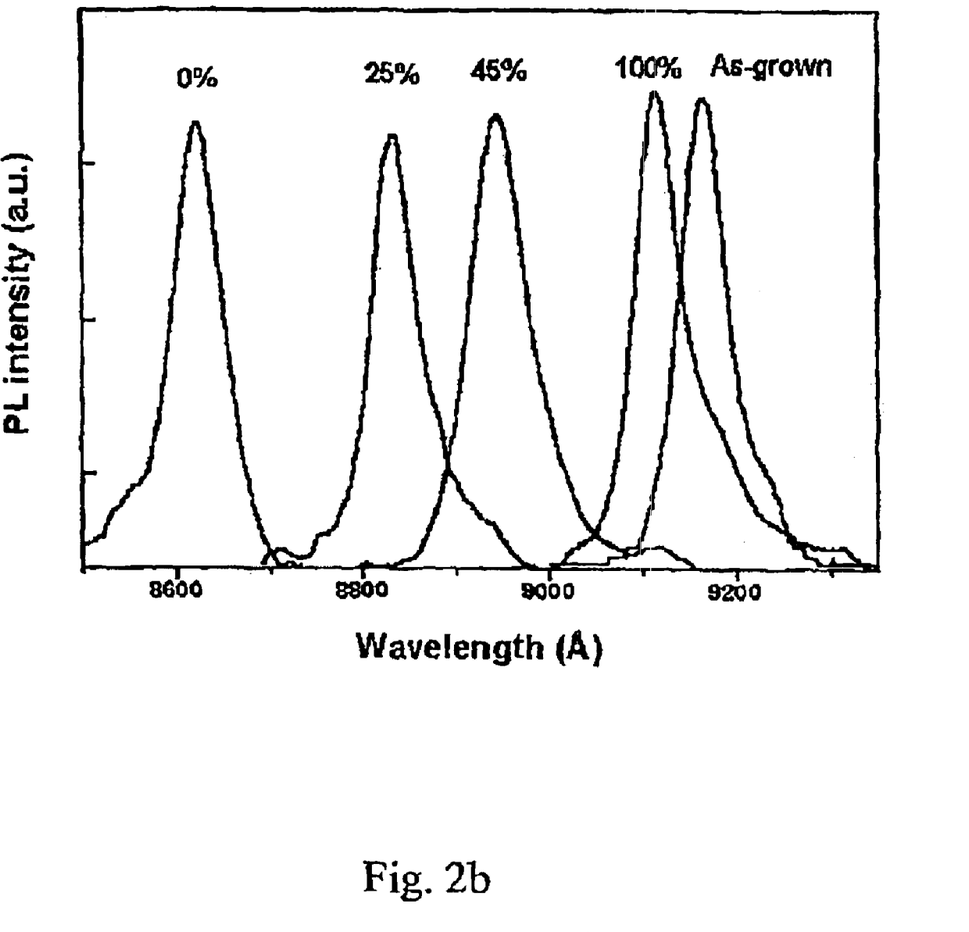

Graded index layers 17 and 20 and separate confinement layers 18 and 19 are provided. Taking the InGaAs/GaAs laser sample with a single 8 nm wide In$_{0.2}$Ga$_{0.8}$As quantum well confined by two 10 nm GaAs barriers as an example, FIG. 2b shows the low temperature photoluminescence spectra of the sample after using the technology of quantum well intermixing with a Ge interlayer controlling band gap tuning. By defining the area of the wafer covered with a Ge layer by varying the spacing between the 1 μm wide Ge strip array, different intermixing degree and hence, different emission wavelengths can be achieved. The Ge coverage for the four regions, 1, 2, 3, 4, in this device are 100%, 45%, 25% and 0% respectively. The Ge strip arrays were formed by evaporating Ge onto the photo-resist patterned GaAs surface followed by lift-off. The whole sample surface was then covered by SiO$_2$ and undergo rapid thermal annealing. The as-grown sample has a peak wavelength at 916 nm or 1.353 meV. The peak position of the PL signals for Y-junction coupler 4 (0% Ge cover) are 77.8 meV and 52.4 meV larger than that of 1 (100% Ge cover) and 2 (45% Ge cover) respectively. The bandgap of isolator (25% Ge cover) is 43 meV larger than channel 1 and 18 meV larger than channel 2. It is transparent to channel 1 but partly absorbing to channel 2.

Figure 3A:
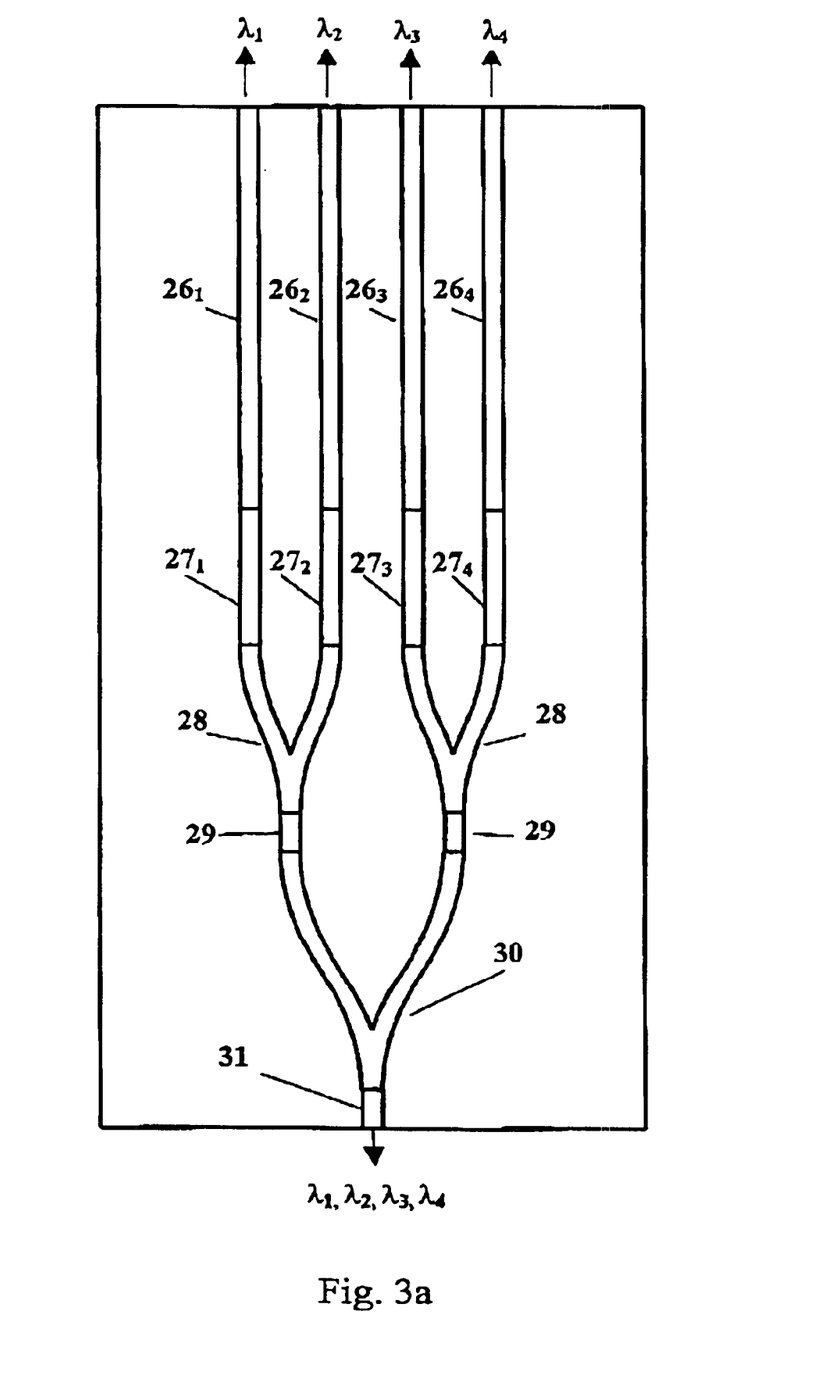
FIGS. 3a and 3b are schematic waveguide drawings for two types of four-wavelength laser sources with monolithically integrated Y-junction couplers and isolators.
Figure 3B:
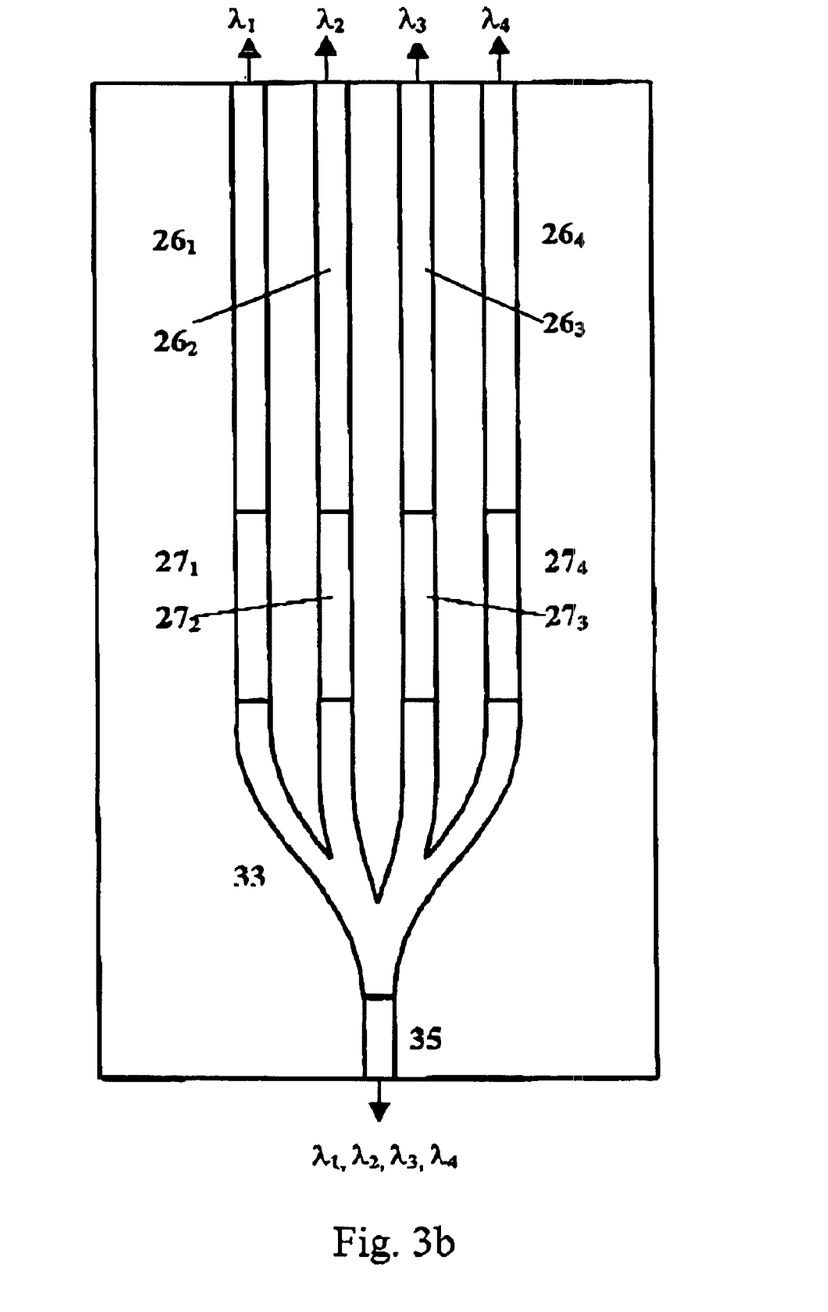

FIG. 3a and FIG. 3b show schematic waveguide diagrams of a four-wavelength laser source emitting from one output port. Four different laser diode sections 26$_1$, 26$_2$, 26$_3$, and 26$_4$ with wavelengths of $\lambda_1$, $\lambda_2$, $\lambda_3$, $\lambda_4$, respectively are provided as are isolator sections 27$_1$, 27$_2$, 27$_3$ and 27$_4$. It is noted that the isolator that is in the path of the shortest wavelength laser diode section is not necessary. If we assume $\lambda_1 > \lambda_2 > \lambda_3 > \lambda_4$, then isolator 27$_4$ can be saved and replaced with the material of the same band gap as the Y-coupler.

In FIG. 3a, the four channels 26 are coupled by two Y couplers 28 to a set of two identical intermediate elements 29, which in turn are coupled by Y coupler 30 to the output waveguide 31. In FIG. 3b, the four channels are coupled by one coupler 33 to the output waveguide 35. Some special treatment should advantageously be taken to this four-branch "Y" coupler, such as the employment of flank wings at the outmost two branches to ensure equal power division in the four branches.

As an example, we assume the energy level of the InGaAs/GaAs Quantum well structure sample, that is for 26$_1$ or $\lambda_1$, is 1.360 eV. Then the energy levels for the other three branches of the laser diode sections 26$_2$ ($\lambda_2$), 26$_3$ ($\lambda_3$), and 26$_4$ ($\lambda_4$), with equal spaced wavelength difference of 12 meV, could be 1.372 eV, 1.384 eV, and 1.396 eV respectively. The energy level for the isolators 27$_1$, 27$_2$, and 27$_3$ could be 1.39 eV, 1.402 eV and 1.414 eV. The band gap of the Y coupler region could be 1.440 eV. So the isolator 27$_1$(27$_2$, 27$_3$) is transparent to laser diode 26$_1$ (26$_2$, 26$_3$) but is absorptive to the other three laser diodes 26$_2$, 26$_3$, and 26$_4$ (26$_1$, 26$_3$, 26$_4$; 26$_1$, 26$_2$, 26$_4$). The wavelength spacings between the two adjacent gain regions can be changed within a range of 10 to 17 meV. These bandgap tuning can be realized by selective area quantum well intermixing carried out on the same wafer, as the method described above, or by selective area MOVPE.

Figure 4:
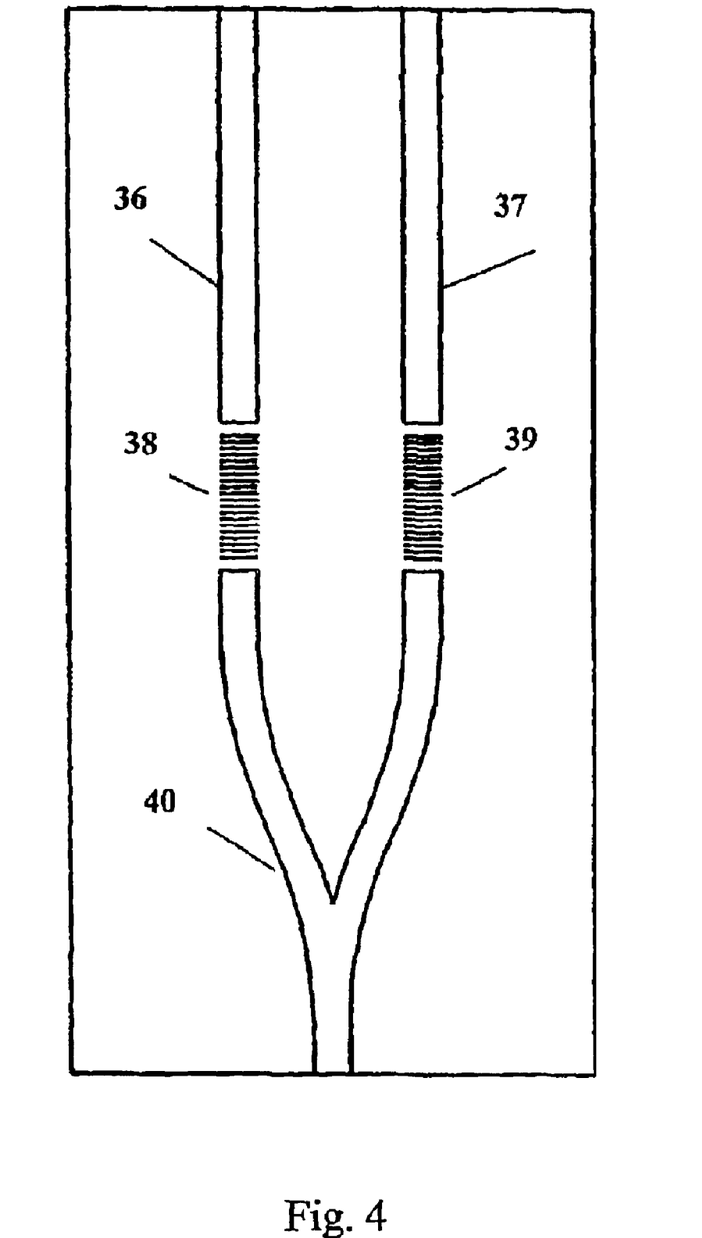
FIG. 4 is a schematic waveguide drawing for a dual wavelength laser source with monolithically integrated Y-junction coupler and distributed Bragg gratings.

Another type of isolators 38, 39 are shown in FIG. 4. They are in the form of distributed Bragg gratings, photonic bandgap crystals, or a stack of layers that are designed to be transmissive only to the laser wavelength of their respective gain regions 36 and 37. Here the distributed Bragg grating does not act as a reflector but as a wavelength filter. The two cleaved facets are still the two mirrors to construct the laser cavity. If the laser diode section 36, 37 are distributed feedback (DFB) laser or distributed Bragg reflecting (DBR) laser, then there will be two different pitch gratings along the light propagation direction. For a dual wavelength integrated laser source, isolators 38 and 39 can be a conventional distributed Bragg grating but be highly reflective to the laser wavelength of their opposite gain regions 37 and 36, rather than 36 and 37, respectively. Using the grating as the isolator, the wavelength difference between the adjacent gain regions can be made very small because of the very sharp wavelength selection characteristics of the gratings. Such an arrangement has a better performance in isolating the crosstalks among different laser wavelengths than the absorption type isolator. However it is more complicated in design and fabrication.

Figure 5A:
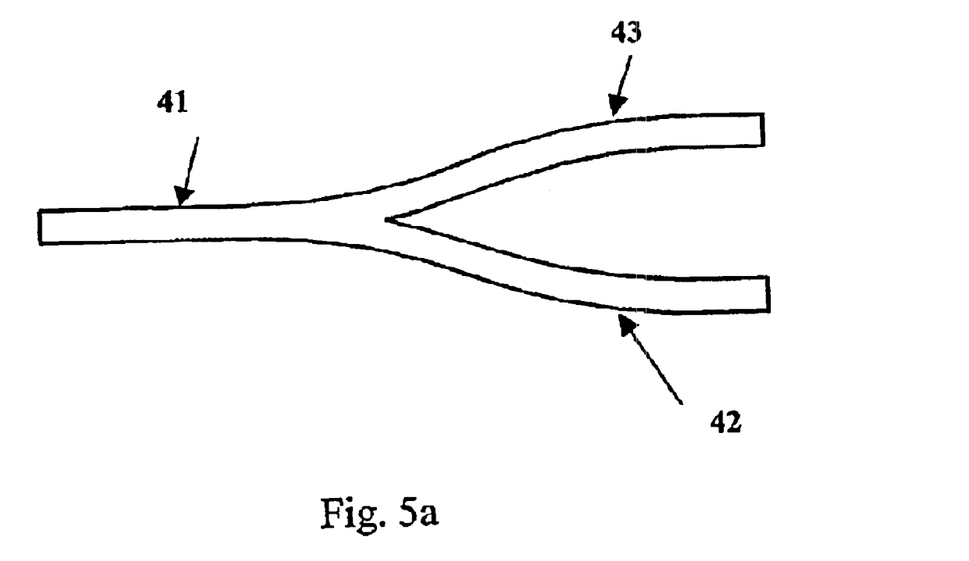
FIGS. 5a and 5b are schematic diagrams of a Y-junction coupler and a rib waveguide directional coupler.
Figure 5B:
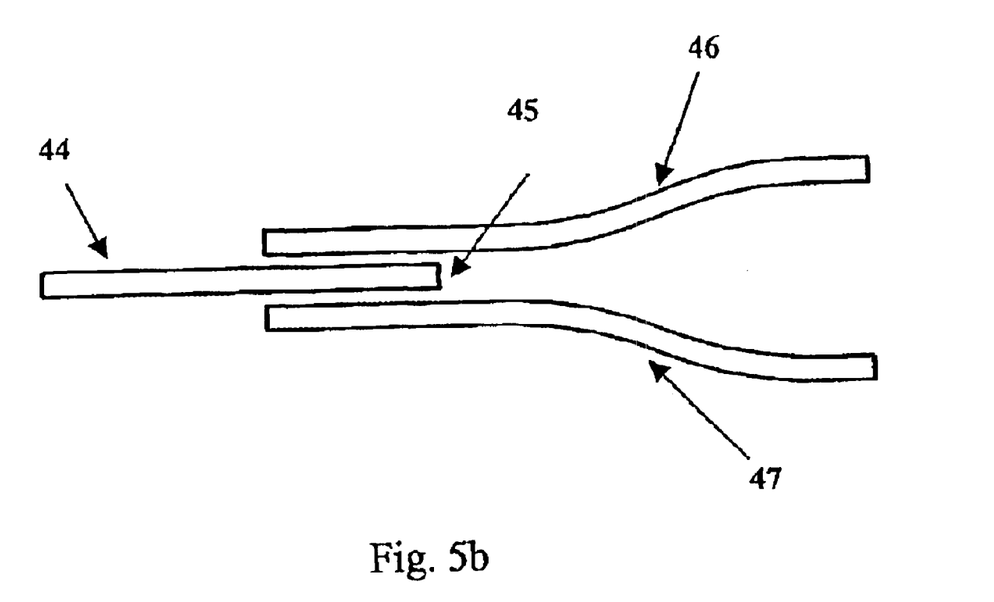

The Y-junction coupler 40 is a 3 port device arranged so that optical power fed into one port is divided equally between the other two ports. One physical form that such a coupler can take is that of a single mode waveguide 41 (FIG. 5a) which divides at a small angle into two single mode waveguides 42, 43. An alternative form is provided by a balanced directional coupler configuration in which the first waveguide 44 (FIG. 5b) terminates in a region where it is symmetrically flanked on both sides by the start of two other waveguides 46,47. The overlapping of the waveguides is such that power launched into the Y-junction coupler via waveguide 44 is fully coupled equally into the other two waveguides so that none is reflected at the end 45 of the first waveguide. The lateral separation of the two ports should be sufficient to provide no mutual evanescence coupling.

In the above explained embodiments, the practice of the invention has been demonstrated in the examples using GaAs type semiconductors. However, it can be effectively applied to all III-V type semiconductors.

While the invention has been described in its preferred embodiments, it is to be understood that the words which have been used are words of description rather than limitation and that changes may be made without departing from the true scope and spirit of the invention in its broader aspects.

What is claimed is:

1. A multi-wavelength semiconductor laser comprising:
  a semiconductor substrate;
  first and second laser diode sections, formed on said semiconductor substrate in parallel arrangement, and having different emission wavelengths relative to each other;
  an isolator section formed on said semiconductor substrate, and being integrated with said first laser diode section for passing emissions by said first laser diode and isolating said first laser diode section from emissions of said second laser diode section;
  a coupler integrated on said semiconductor substrate with said first and second laser diode sections and said isolator section to couple said different emission wavelengths into one output port.

2. A multi-wavelength semiconductor laser according to claim 1, wherein said isolator section is a light absorptive type isolator.

3. A multi-wavelength semiconductor laser according to claim 1, wherein said isolator section is a wavelength selective type isolator.

4. A multi-wavelength semiconductor laser according to claim 3, wherein said isolator section is a Bragg grating type isolator or photonic bandgap crystal type isolator which is transmissive to a wavelength which is equivalent to said emission wavelength of said first laser diode section.

5. A multi-wavelength semiconductor laser according to claim 1, wherein said coupler is a Y-junction coupler, a multi-branch waveguide coupler or a waveguide directional coupler.

6. A multi-wavelength semiconductor laser according to claim 1, wherein said multi-wavelength semiconductor laser is a dual wavelength semiconductor laser.

7. A multi-wavelength semiconductor laser according to claim 6, wherein said coupler is a Y-junction coupler.

8. A multi-wavelength semiconductor laser according to claim 1, wherein said multi-wavelength semiconductor laser comprises four laser diode sections, at least three of said laser diode sections being integrated with a respective isolator section.

9. A multi-wavelength semiconductor laser according to claim 8, wherein said coupler includes two Y-junction couplers, each of which is integrated with two of said laser diode sections, a pair of identical intermediate elements each coupled to a respective one of said Y-junction couplers and a further Y-junction coupler coupled to said intermediate elements to provide said outlet port.

10. A multi-wavelength semiconductor laser according to claim 8, wherein said coupler is a four-branch coupler.

11. A multi-wavelength semiconductor laser according to claim 1, comprising a quantum well laser structure.

12. A multi-wavelength semiconductor laser according to claim 11, wherein said semiconductor substrate is formed from GaAs and said quantum well is formed from GaAs, InGaAs or InAlGaAs.

13. A multi-wavelength semiconductor laser according to claim 11, wherein said semiconductor substrate is formed from InP and said quantum well is formed from InGaAsP, InGaAs, or InAlGaAs.

14. A multi-wavelength semiconductor laser according to claim 1, wherein said semiconductor laser is formed by a process of one of selective area metal organic vapor phase epitaxy (MOVPE) and selective area quantum well intermixing.

15. A multi-wavelength semiconductor laser comprising:
  first and second laser diode sections in parallel arrangement formed on a semiconductor substrate, said first laser diode section emitting light at a first emission wavelength, said second laser diode section emitting light at a second emission wavelength;
  a coupler comprising fist and second inputs and an output for coupling emissions of said first and second laser diode sections provided at said first and second inputs respectively to said output; and
  an isolator that passes emissions at said first wavelength and substantially attenuates emissions at said second wavelength, formed on said semiconductor substrate between said first input and said first laser diode section to isolate said first laser diode section from emissions of said second laser diode section.

* * * * *